United States Patent [19]

Shekerjian

[11] Patent Number: 4,622,434

[45] Date of Patent: Nov. 11, 1986

[54] SEMICONDUCTOR DEVICE PACKAGE AND METHOD THEREOF

[75] Inventor: Hart Shekerjian, Paradise Valley, Ariz.

[73] Assignee: Motorola Inc., Schaumburg, Ill.

[21] Appl. No.: 672,760

[22] Filed: Nov. 19, 1984

[51] Int. Cl.⁴ .............................................. H05K 5/03
[52] U.S. Cl. .................................. 174/52 H; 29/588; 219/117.1; 357/74
[58] Field of Search ....................... 174/52 H; 357/74; 29/588; 219/117.1, 93, 85 M, 85 CM, 85 CA; 403/12, 109, 283, 274, 345; 220/352, 356, 357, 306; 285/22, 23, 304

[56] References Cited

U.S. PATENT DOCUMENTS

| Re. 26,899 | 5/1970 | Dion et al. | 174/52 H |
| 3,211,827 | 10/1965 | Trueb et al. | 174/52 H |
| 4,456,334 | 6/1984 | Henry et al. | 357/74 X |

Primary Examiner—Arthur T. Grimley
Assistant Examiner—D. A. Tone
Attorney, Agent, or Firm—Jonathan P. Meyer; Raymond J. Warren

[57] ABSTRACT

Packaging of discrete semiconductor devices is improved by dimpling metal caps prior to assembly onto headers and welding.

The dimpled caps provide a friction fit to the headers, whereby fewer assembled, but unwelded packages separate during handling. The dimples are more economical and more reliable than prior art crimps which perform a similar function.

8 Claims, 7 Drawing Figures

SEMICONDUCTOR DEVICE PACKAGE AND METHOD THEREOF

FIELD OF THE INVENTION

The present invention relates, in general, to a metal package for discrete semiconductor devices. More particularly, the invention relates to an improved package and method of packaging which renders the process of packaging discrete semiconductor devices more efficient.

BACKGROUND OF THE INVENTION

Two part metal packages, commonly referred to as cans, are widely used in the semiconductor industry to contain discrete devices such as transistors. Such packages typically comprise a header upon which a semiconductor device, or die, is bonded and a cap which covers the device on the header and is welded to the header to create a hermetically sealed environment for the device.

When packaging semiconductor devices in metal cans, one must place the cap over the appropriate location on the header after the die bond and wire bond processes are complete. Next, the assembled, but unwelded package must be moved to a welding machine to finish the packaging operation. In many instances, these operations must take place in a controlled environment, such as a glove box, to ensure that the atmosphere sealed into the package is non-destructive.

In order that the unit cost of the headers and caps be reasonable, the dimensional control in their manufacture is somewhat relaxed. Thus, the fit between any particular header and any particular cap is likely to be somewhat sloppy until the weld is accomplished. This presents the problem that the assembled, but unwelded package may come apart during the handling necessary between the assembly and welding operations. This is particularly likely and troublesome when these operations are performed by hand in a glove box. In that case, the operator's dexterity is somewhat limited and the efficiency of the operation is very quickly reduced by significant separation of headers and caps.

Previously, the mechanical integrity of the assembled, but unwelded parts was improved by means of a slight deformation of the caps prior to assembly. This was accomplished by feeding the caps between a pair of spinning wheels which were spaced so as to slightly crimp the caps. This method did improve the mechanical integrity of the unwelded packages. However, it was found that an amount of crimping comparable to the tolerance in the caps as delivered by the vendor is need to adequately hold the caps on the headers. As will be apparent to one skilled in the art, it is extremely difficult to reliably apply a deformation in an amount comparable to the tolerance of that dimension of a part. This results in some parts which are overcrimped and will not properly seat on a header and in some parts which are undercrimped and will not stay on the header.

SUMMARY OF THE INVENTION

Accordingly, it is an object of the present invention to provide an improved semiconductor device package and method of packaging.

It is a further object of the present invention to provide an improved metal package for discrete devices which economically solves the problem of the mechanical integrity of the assembled, but unwelded package.

Yet a further object of the present invention is to provide an improved method of deforming metal package caps to improve adherence of the caps to the headers prior to welding.

These and other object and advantages of the present invention are provided by imparting a dimple to metal caps prior to assembly of the semiconductor package. The dimples are created by means of a punch or similar apparatus and are placed a small distance above the cap flange so that the dimpled portion of the cap fits over the shoulder of the header and provides a friction fit therebetween. The assembled, but unwelded packages produced by this method exhibit good integrity during handling prior to the welding operation.

These and other objects and advantages of the present invention will be apparent to one skilled in the art from the detailed description below taken together with the drawings.

DETAILED DESCRIPTION OF THE INVENTION

Figure 1:
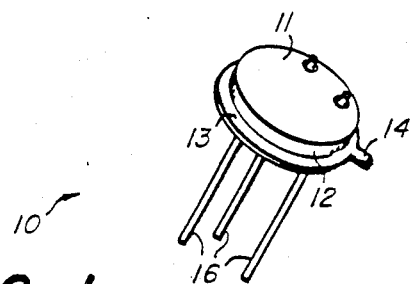
FIG. 1 is a perspective view of a typical header portion of a metal package for discrete semiconductor devices.

FIG. 1 is a perspective view of a typical header portion 10 of a metal package for discrete semiconductor devices. Header portion 10 comprises a generally planar top portion 11 onto which the semiconductor device or devices are bonded, an annular shoulder 12 extending downward from the periphery of top portion 11 and an annular flange 13 extending outwardly from the bottom of shoulder 12. A tab 14 extending outwardly from flange 13 serves merely as an orientation guide and is unrelated to the present invention. Leads 16 provide the means by which the device or devices enclosed in the package are electrically connected into an electrical circuit. Typically, two of the three leads 16 penetrate header 10 through top portion 11.

Figure 2:
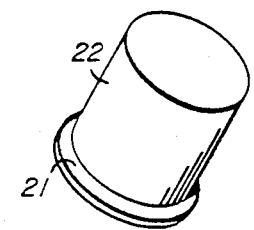
FIG. 2 is a perspective view of a typical cap portion of metal package for discrete semiconductor devices.

FIG. 2 is perspective view of a typical cap portion 20 of a metal package for discrete semiconductor devices. Cap portion 20 includes a generally cylindrical body portion 22, which has one closed end and one open end, and an annular flange 21 extending outward from body portion 22 around the open end thereof. Cap portion 20 is designed to fit over header portion 10 (FIG. 1) so that flange 21 of cap 20 mates with flange 13 of header 10. A subsequent welding operation creates a weld between flange 21 and flange 13, thereby sealing the package. As is apparent, the inside diameter of body portion 22 of cap 20 must be slightly larger than the diameter of shoulder portion 12 of header 10.

The prior art crimping method of providing a friction fit between cap 20 and header 10 involved the reduction of the inside diameter of body portion 22 of cap 20 by means of crimping. The crimp was applied on the portion of body 22 immediately above flange 21. When the crimp was properly applied, this provided a friction fit between body portion 22 and shoulder 12, thereby maintaining cap 20 on header 10 during handling prior to the welding operation. However, accurately applying the amount of crimp required is extremely difficult. This may be appreciated by referring to a particular package, commonly referred to as a T0-46 package. The inside diameter of the cap of such a package is typically specified to be 0.168 inches. However, this dimension will vary by several thousands of an inch, or mils, from one cap to another. It has been found that reduction of this inside diameter to approximately 0.164 inches provides an appropriate friction fit. Thus, it is necessary to apply approximately 4 mils of crimp to a part which demonstrates several mils of variation. Doing this accurately and repeatably is extremely difficult.

Figure 3:
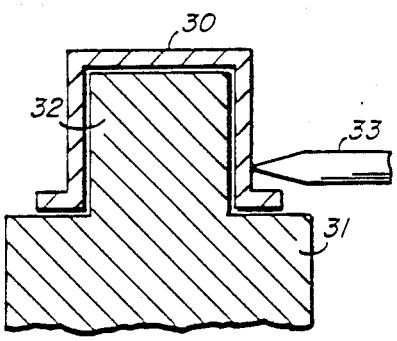
FIG. 3 is a cross sectional view of an apparatus for dimpling metal caps.

FIG. 3 is a cross sectional view illustrating an apparatus and method for dimpling a metal cap 30 of the type described above. Cap 30 is placed on a mandrel 31. Mandrel 31 has a portion 32 over which cap 30 fits. The outside diameter of portion 32 of mandrel 31 is slightly smaller than the inside diameter of cap 30. A punch 33 is brought into position against cap 30 and is used to place a dimple in cap 30. The force needed to produce a dimple of the desired depth in cap 30 must be determined in each application. It has been found that a dimple which reduces the inside diameter of cap 30 at the location by approximately 3–5 mils is generally useful. In addition to that shown in FIG. 3, many other means of dimpling metal caps will be apparent to those skilled in the art.

Figure 4:
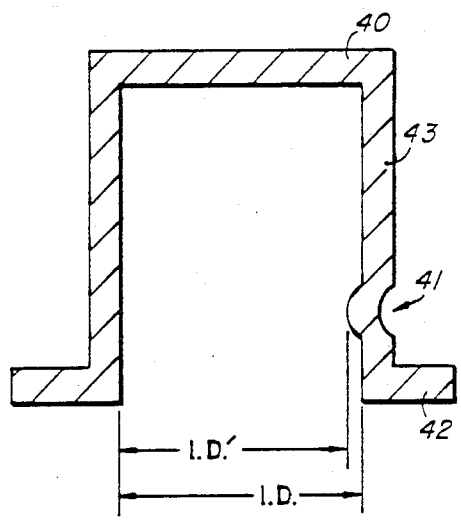
FIG. 4 is a cross sectional view of a dimpled metal cap.

FIG. 4 is a cross sectional view of a dimpled cap 40 of the type described above. Dimple 41 is located on body portion 43 of cap 40 at a location immediately above flange 42. The location of dimple 41 with relation to flange 42 must be determined for each type of package. It is necessary that dimple 41 be low enough on body portion 43 to engage the shoulder portion of the header when the two flanges are in contact.

Dimple 41 reduces the local inside diameter of body portion 43 of cap 40 by an amount to be determined in each particular circumstance. In the case of a T0-46 package the undimpled inside diameter is approximately 0.168 inches. It has been found that if dimple 41 is such that a plug gauge of 0.164 inches may be inserted into cap 40, the desired degree of friction fit between the cap and the header will be obtained. Many manufacturers of metal packages may be able to supply dimpled caps. One such supplier, which is capable of supplying dimpled caps, is Truelove and MacLean, Inc., of Waterbury, Conn.

Figure 5:
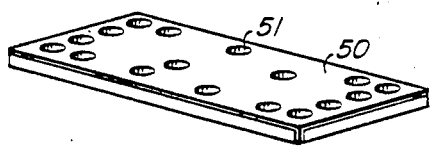
FIG. 5 is a perspective view of a plate useful in assembling dimpled metal caps.
Figure 6:
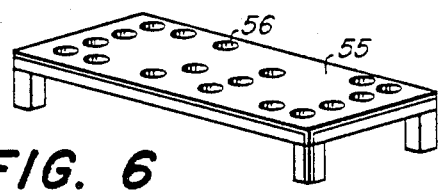
FIG. 6 is a perspective view of a jig useful for assembling headers and dimpled metal caps.
Figure 7:
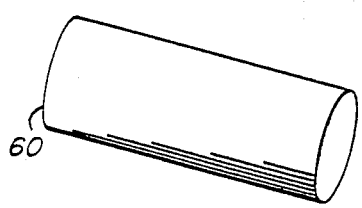
FIG. 7 is a perspective view of a tool useful for assembling packages according to the principles of the present invention.

Referring to FIGS. 5, 6 and 7 a method of assembling headers and dimpled caps is described. The method described is suitable for relatively low volume assembly. Other methods including those suitable for high volume automated assembly will be apparent. A plate 50 (FIG. 5) has a plurality of holes 51 disposed in a regular array therein. Each hole 51 is dimensioned to hold 1 single cap of the type described. The welding flange of each cap rests upon the top surface of plate 50 and restricts the cap from falling through hole 51. The first step in the assembly process involves inserting a cap into each of the holes 51 in plate 50. A magnetic plate (not shown) is then placed on the back side of plate 50 to hold the caps in holes 51 so that plate 50 may be inverted.

A tray 55 (FIG. 6) has a plurality of holes 56 disposed in a regular array therein. The arrangement of holes 56 in tray 55 is the same as the arrangement of holes 51 in plate 50. Each hole 56 in tray 55 is dimensioned to hold a single header of the type described above. The leads of each header extend through hole 56 and the welding flange of each header restricts the header from falling through hole 56. As is apparent, once a header has been inserted in each hole 56, plate 50 may be inverted over tray 55 whereby a plurality of caps in plate 50 may be placed in registration over a plurality of headers in tray 55. The magnetic plate which is holding the caps into the holes in plate 50 is then removed and plate 50 is removed. Due to the friction fit between the caps and the headers caused by the dimples in the caps, the caps will not be fully seated on the headers at this point.

A seating tool 60 (FIG. 7), which is typically a cylinder of Teflon or similar non-contaminating material, is then rolled across the tops of the caps to cause them to seat fully on the heads. This results in tray 55 being loaded with a plurality of assembled, but unwelded packages which may be handled in any way desirable prior to welding without danger of unseating the caps from the headers.

It will be apparent that an improved method and apparatus for packaging semiconductor devices has been disclosed. A simple and inexpensive dimple in metal caps which may be reliably and repeatably applied, solves the problem of separation of assembled, but unwelded metal semiconductor packages.

I claim:

1. A package comprising:
   a header;
   cap means for mating with said header to form an enclosure; and
   dimple means on said cap means for frictionally engaging said header.

2. A package according to claim 1 wherein said header further comprises:
   a top portion;
   a shoulder portion extending downward from a periphery of said top portion; and
   an annular flange portion extending outward from a lower end of said shoulder portion.

3. A package according to claim 2 wherein said cap means further comprises:
   a body portion adapted to fit over said shoulder portion of said header; and
   an annular flange portion adapted to contact said annular flange of said header, said dimple means being located on said body portion to engage said shoulder portion of said header means.

4. A package adapted to contain a semiconductor device comprising:
   header means for holding said semiconductor device;
   cap means for mating with said header means to form an enclosure about said device; and
   dimple means on said cap means for frictionally engaging said header means.

5. A package according to claim 4 wherein said header means further comprises:
   a top portion;
   a shoulder portion extending downward from a periphery of said top portion; and an annular flange portion extending outward from a lower end of said shoulder portion.

6. A package according to claim 5 wherein said cap means further comprises:
 a body portion adapted to fit over said shoulder portion of said header means; and
 an annular flange portion adapted to contact said annular flange of said header means, said dimple means being located on said body portion to engage said shoulder portion of said header means.

7. A package comprising a header and a cap adapted to fit on and be welded to said header wherein the improvement comprises:
 dimple means on said cap for frictionally engaging said header when said cap is placed thereon.

8. A method of assembling a semiconductor device package comprising a header and a cap comprising the steps of:
 dimpling said cap to provide a friction fit between said cap and said header;
 assembling said cap and said header; and welding said cap and said header.

* * * * *